United States Patent
Bollenbeck

(10) Patent No.: US 10,048,342 B2
(45) Date of Patent: Aug. 14, 2018

(54) RECEPTION SYSTEM FOR LOCAL COILS OF A MAGNETIC RESONANCE IMAGING SYSTEM

(71) Applicant: Jan Bollenbeck, Eggolsheim (DE)

(72) Inventor: Jan Bollenbeck, Eggolsheim (DE)

(73) Assignee: Siemens Aktiengesellschaft, Munich (DE)

( * ) Notice: Subject to any disclaimer, the term of this patent is extended or adjusted under 35 U.S.C. 154(b) by 721 days.

(21) Appl. No.: 14/670,817

(22) Filed: Mar. 27, 2015

(65) Prior Publication Data

US 2015/0285887 A1   Oct. 8, 2015

(30) Foreign Application Priority Data

Apr. 2, 2014   (DE) .................. 10 2014 206 311

(51) Int. Cl.
*G01R 33/56* (2006.01)
*G01R 33/385* (2006.01)
*G01R 33/36* (2006.01)

(52) U.S. Cl.
CPC ......... *G01R 33/56* (2013.01); *G01R 33/3621* (2013.01); *G01R 33/385* (2013.01)

(58) Field of Classification Search
CPC .. G01R 33/3621; G01R 33/385; G01R 33/56; G01R 33/3664

(Continued)

(56) References Cited

U.S. PATENT DOCUMENTS 5,170,123 A    12/1992  Holland et al.
6,259,253 B1 *  7/2001  Ellingson ........... G01R 33/3621
                                                    324/322

(Continued)

FOREIGN PATENT DOCUMENTS

CN    102053223 A    5/2011
CN    102565733 A    7/2012

(Continued)

OTHER PUBLICATIONS

Chinese Office Action for related Chinese Application No. 201510028583.3 dated Jul. 3, 2017 with English translation.

(Continued)

*Primary Examiner* — Melissa Koval
*Assistant Examiner* — Rishi Patel
(74) *Attorney, Agent, or Firm* — Lempia Summerfield Katz LLC

(57) ABSTRACT

An apparatus, a magnetic resonance imaging system, and a method of use are provided for a reception system for transmitting magnetic resonance signals from local coils to an image processing unit of a magnetic resonance imaging system. The apparatus includes an analog receiver for receiving and processing analog signals from the local coils that is configured to directly sample analog signals having different individual frequency bands and/or frequency band pairs, to distinguish the analog signals and to process them differently. The apparatus also includes an A/D converter for converting the processed analog signals from the local coils into digital signals. The apparatus further includes a digital signal processor for processing the digital signals, wherein the digital signal processor includes a Weaver unit and a downstream decimation filter unit.

19 Claims, 3 Drawing Sheets

(58) Field of Classification Search
USPC .................................................. 324/318–322
See application file for complete search history.

(56) References Cited

U.S. PATENT DOCUMENTS

| | | | | |
|---|---|---|---|---|
| 2006/0103386 A1* | 5/2006 | Buchwald | .......... | G01R 33/3621 |
| | | | | 324/322 |
| 2007/0010733 A1* | 1/2007 | Nemoto | ............. | G01R 33/3621 |
| | | | | 600/410 |
| 2009/0286478 A1 | 11/2009 | Biber et al. | | |
| 2011/0109315 A1 | 5/2011 | Biber et al. | | |
| 2014/0028312 A1 | 1/2014 | Popescu | | |
| 2014/0361775 A1 | 12/2014 | Qiu et al. | | |

FOREIGN PATENT DOCUMENTS

| | | |
|---|---|---|
| DE | 102008023467 | 12/2009 |
| DE | 102012212947 A1 | 1/2014 |
| EP | 0412747 A2 | 2/1991 |
| JP | 2009273889 A | 11/2009 |
| WO | WO2006075214 A2 | 11/2006 |

OTHER PUBLICATIONS

Pedro Cruz et al., Receiver Front-End Architectures—Analysis and Evaluation, Mar. 2010, pp. 495-521, intechopen.com.
Richard Lyons, Digital Signal Processing: Frequency Translation without Multiplication, Sep. 2007, eetindia.com.
Scott Greig et al., Polyphase Techniques for Low Cost MRI Receivers, Stanford University.

\* cited by examiner

RECEPTION SYSTEM FOR LOCAL COILS OF A MAGNETIC RESONANCE IMAGING SYSTEM

CROSS-REFERENCE TO RELATED APPLICATIONS

This application claims the benefit of DE 10 2014 206 311.6, filed on Apr. 2, 2014, which is hereby incorporated by reference in its entirety.

TECHNICAL FIELD

The embodiments relate to an apparatus and a method for a reception system for transmitting magnetic resonance signals from local coils to an image processing unit of a magnetic resonance imaging (MRI) system. The embodiments also relate to a magnetic resonance imaging system having the reception system and to a further handling device for the received signals.

BACKGROUND

In the text below, the two terms magnetic resonance imaging system and magnetic resonance imaging scanner are used synonymously.

Magnetic resonance imaging scanners simultaneously receive a multiplicity of magnetic resonance signals via local antennas that are applied to the patient and that are part of a number of local coils. The analog magnetic resonance signals received in the process are supplied, particularly following preamplification, to a reception system, processed further therein on an analog basis, digitized and forwarded to an image reconstruction unit as raw data in order to reconstruct image data.

A fundamental problem in this case is that local coils from a more recent generation are incompatible with the reception systems of MRIs from an earlier generation, and also vice versa.

The patent specification DE 10 2008 023 467 B4 describes an arrangement for transmitting magnetic resonance signals in which the individual received signals from the local antennas of the local coils are first of all converted in pairs into dedicated intermediate frequency bands and are then transmitted in pairs using a 2:1 frequency division multiplex method (FDM) via a common line. In this case, the two intermediate frequency bands are arranged mirror-symmetrically with respect to a sampling rate of a downstream analog/digital conversion section. As a result, the two bands appear at the same position in baseband following sampling. By way of example, in the case of local coils from a more recent generation (TiM4G 1.5 T systems), the received signal is converted from 63.6 MHz with local oscillator signals at frequencies of 55 MHz and 75 MHz to intermediate frequency bands around 8.6 MHz and 11.4 MHz. The bandwidth of the received signal may be up to ±500 kHz in this case. Following spectral separation and subsequent sampling at 10 MS/s in each case, both signals appear at a second (e.g., digital) intermediate frequency of 1.4 MHz in the correct position in each case. By way of example, the reception paths of the TiM4G systems are based on the architecture depicted in FIGS. 3 and 4 in the patent specification DE 10 2008 023 467 B4. The resulting 1.4 MHz baseband signals are transferred to the digital signal processing section at a data rate of 10 MS/s.

The "TiM LC interface" carries a respective MR received signal per coaxial connector at the RF level (e.g., 63.6 MHz in the case of 1.5 T systems), while the "TiM4G-LC interface" carries two MR signals per coaxial connector using frequency division multiplexing at an intermediate frequency level (e.g., 8.6 MHz and 11.4 MHz in the case of 1.5 T systems; in this regard see the patent specification DE 102008023467 B4).

Further properties of "TiM local coils" from an earlier generation and "TiM4G local coils" from a more recent generation include the following.

TiM refers to local coil signal transmission at the MR frequency (RF transmission), and 8 local coil signals per local coil connector.

TiM4G refers to frequency conversion of the local coil signal within the local coil and local coil signal transmission at two intermediate frequencies (e.g., 2:1 frequency division multiplexing symmetrically with respect to 10 MHz; such as at 8.6 MHz and 11.4 MHz, which is to say 10 MHz+−1.4 MHz, in the case of 1.5 T), and 24 local coil signals per local coil connector.

SUMMARY AND DESCRIPTION

The scope of the present invention is defined solely by the appended claims and is not affected to any degree by the statements within this summary. The present embodiments may obviate one or more of the drawbacks or limitations in the related art.

It is therefore an object of the present embodiments to specify an improved reception system for local coils of a magnetic resonance imaging scanner for transmitting received magnetic resonance signals, in which local coils from an earlier and a more recent generation may be used on reception systems of MRIs from both an earlier and a more recent generation.

In particular, the intention is to allow selective use of "TiM local coils" from an earlier generation and "TiM4G local coils" from a more recent generation on reception systems of MRIs both from an earlier and a more recent generation.

The apparatus for a reception system, (e.g., a magnetic resonance imaging system received-signal further handling device), for transmitting magnetic resonance signals from local coils to an image processing unit of a magnetic resonance imaging system includes an analog receiver for receiving and processing analog signals from the local coils that is configured to directly sample analog signals having different individual frequency bands and/or frequency band pairs, to distinguish the analog signals and to process them differently, particularly without changing the frequencies and/or without spectral separation of the frequency band pairs. The apparatus further includes an A/D converter for converting the processed analog signals from the local coils into digital signals. The apparatus further includes a digital signal processor (DSP) for processing the digital signals further, containing a Weaver unit and a downstream decimation filter unit.

In this context, the term "Weaver unit" or "Weaver architecture" describes what is known as an "image reject receiver", named after Donald K. Weaver. He published his idea as early as in the 1950s. An image reject receiver has the property of rejecting the mirror-image frequency band causing disturbance during frequency conversion (e.g., mixing). Upstream filtering (e.g., a mirror-image frequency filter) is not necessary.

The "Weaver architecture" may be considered to be a further development of what is known as the "Hartley Architecture", in which the input signal has its frequency converted in a 90 quadrature mixer and is filtered. Mixing with sinusoidal and cosine signals prompts the two mix products to have a phase offset of 90° in relation to one another. The signal phase is additionally shifted through 90° in one of the two paths. This produces two signals that have the same phase for the useful band and offset phases for the mirror-image band. During the subsequent signal addition, the signal components of the mirror-image band cancel one another out. By replacing the addition with subtraction, the mirror-image band is exchanged for the useful band (e.g., reception band changeover).

In the Weaver architecture, the 90° phase shifter is replaced by a further quadrature mixer. This is advantageous because the implementation of a wideband phase shifter is complex (e.g., what is known as a "Hilbert Filter").

Given suitable interpretation of the frequency plan, no "genuine" multipliers are needed in a (e.g., digital) arrangement of the Weaver architecture. Arithmetic signs are merely changed. The Weaver architecture is therefore particularly suitable for a digital implementation.

The DSP has the task of isolating the two FDM channels from one another (e.g., in TiM4G mode) and reducing the data rate of the data coming from the ADC from 80 MS/s, for example, to 10 MS/s, for example ("downsampling"). In this case, the input signal is converted into a low frequency. The use of Weaver architecture in this case allows implementation with comparatively low filter complexity.

By contrast, very high demands would be placed on the isolation filter in the case of spectral isolation of the two FDM channels by classical filtering. For example, it follows from the condition SR≥2×Fmax (Nyquist-Shannon sampling theorem for lowpass signals) that the isolation filter needs to operate at a data rate of greater than 2×Fmax=2× (e.g., 11.4 MHz+0.5 MHz)=23.8 MS/s. In order to keep the demands on the decimation filter crossover range (e.g., useful/stop band) feasible, the frequency band of the signal may be at a sufficient spectral distance from the limits of the respective Nyquist band, however. For practical reasons, a data rate of 30 MS/s or 40 MS/s will therefore be chosen.

The crossover range of the useful band/stop band isolation filter extends from (e.g., 8.6 MHz+0.5 MHz) to (e.g., 11.4 MHz−0.5 MHz), which is to say just from 9.1 MHz to 10.9 MHz, or just over 1.8 MHz. This magnitude in relation to the present data rate has a critical influence on the required complexity for implementing the isolation filter (e.g., filter order).

A further important manipulated variable for determining the complexity for implementing a filter is what is known as the ripple in the frequency response in the region of the passband. Demands so as not to corrupt a signal too greatly may permit discrepancies in the signal attenuation in the passband to a maximum of one decibel (that is to say +−0.5 dB). Since, as already described, the two frequency bands (or channels) to be isolated are very close to one another in terms of spectrum, enormous demands arise when low ripple in the passband and an attenuation of at least −40 dB in the stop band are provided to be implemented simultaneously. The specified demands may be met only by high-order digital filters (e.g., high-order finite impulse response (FIR) filters). Hence, a complex filter with a large number of adders, subtractors (in cascaded integrator comb (CIC) filters) and multipliers (e.g., in the form of FIR filters) is needed. Taking account of the available FPGA resources and above all the energy consumption, implementability limits are reached quickly in this case. Added to this is the fact that, in view of the emission of unwanted signals, it is desirable to have the smallest possible number of digital operations close to the magnetic resonance reception antennas of the reception coils.

In the embodiment depicted, the ADC signal is converted into an intermediate frequency at 1.4 MHz. The intermediate frequency and the frequency position (e.g., same or inverse position) are identical for both modes of operation (TiM4G or TiM). Conversion is effected on the basis of:

TiM: 63.6 MHz±500 kHz at 80 MS/s=>1.4 MHz±500 kHz at 10 MS/s

TiM4G IF1: 8.6 MHz±500 kHz at 80 MS/s=>1.4 MHz±500 kHz at 10 MS/s

TiM4G IF2: 11.4 MHz±500 kHz at 80 MS/s=>1.4 MHz±500 kHz at 10 MS/s

By way of example, the frequency bands are situated at 63.6 MHz±500 kHz for what are known as TiM local coils in the TiM mode of the apparatus and the frequency band pairs are situated at, by way of example, 8.6 MHz and 11.4 MHz±500 kHz for what are known as TiM4G local coils in the TiM4G mode of the apparatus.

The A/D converter of the analog receiver for converting the processed analog signals from the local coils into digital signals operates under the sampling frequency/clock rate of 80 MS/s, for example.

In this case, the digital signal processor may sample the digital signals at a reduced sampling frequency/clock rate of 40, 20 or 10 MS/s, for example, and may convert the input signal frequency bands into an intermediate frequency band of 1.4 MHz, or intermediate frequency band pair of 1.4 MHz, for example.

The embodiments have a receiver architecture (analog signal processing and DSP) that allows TiM4G received signals (IF frequency division multiplex signal) and TiM received signals (RF signal, MR frequency) to be processed. A skillful combination of a "Weaver architecture" with decimation filters and FS/4 or FS/2 frequency conversion results in a reception system that is very efficient in terms of FPGA resources and power.

Certain advantages of the embodiments include the following.

The architecture serves both modes of operation (TiM4G and TiM). There is merely a need for the specific parameterization of a filter and of a 1, −1, 1, −1 oscillator for frequency conversion.

TiM4G and TiM signals appear at the output of the DSP at an identical frequency position (in this case 1.4 MHz at 10 MS/s). The subsequent processing does not need to distinguish between the modes.

The mode of operation may be selected either by software or by a 1-bit control signal.

No genuine NCOs (Numeric Controlled Oscillator) are required. There is merely "multiplication" by 0, 1, −1, 0 (FS/4 frequency conversion) and 1, −1, 1, −1 (FS/2 frequency conversion) sequences.

Easily met filter demands arise, particularly in TiM4G mode.

The provision of such a multimode LC interface requires a suitable multimode receiver for the corresponding signal processing.

The multimode receiver has the task of converting the LC received signals from analog to digital following analog preprocessing and then processing them further such that the receiver output data may be transferred to the further signal processing in an efficient data format. In this case, the data format of the output data is independent of the currently selected mode of operation (e.g., TiM or TiM4G mode). In this context, "efficient data format" of the output data from the A/D converter provides that as little redundant information as possible is also transmitted, e.g., the ratio of signal bandwidth to Nyquist bandwidth (or FS/2) is provided to be as close to 1 as possible.

In addition, the present embodiments also include a method for operating an apparatus for a reception system, particularly a magnetic resonance imaging system received-signal further handling device, for transmitting magnetic resonance signals from local coils to an image processing unit of a magnetic resonance imaging system, wherein (1) analog signals from the local coils having at least two different frequency bands and/or frequency band pairs are directly sampled, distinguished and processed differently without changing the frequencies and/or without spectral isolation of the frequency band pairs, (2) the processed analog signal from the local coils are converted into digital signals, and (3) the frequency bands of the frequency band pairs are isolated from one another and the frequency of these and of the individual frequency bands is converted and the data rates thereof are reduced.

In this case, the digital signals may be sampled at a reduced sampling frequency/clock rate of 40, 20, or 10 MS/s, for example, and converted into an intermediate frequency band of 1.4 MHz, for example, or intermediate frequency band pair of 1.4 MHz, for example.

A large proportion of the aforementioned components of the apparatus, particularly the detection unit, a provision unit, an ascertainment unit, a determination unit, and/or signal generation unit, may be implemented entirely or partly in the form of software modules in a processor of an appropriate control device of a magnetic resonance imaging scanner. This is advantageous in this respect because a software installation may also upgrade already existent control devices for carrying out the method. The embodiments also include a computer program product that may be loaded directly into a processor of a programmable control device of a magnetic resonance imaging scanner, having program code provided in order to carry out all the acts of the method when the computer program is executed in the control device.

The analog receiver of the apparatus has an input diplexer having a highpass path and a lowpass path.

The highpass path of the input diplexer contains a changeover switch for feeding back a local oscillator frequency to the input diplexer and then to the local coils.

Adjoining downstream (e.g., in the direction of the A/D converter for signaling purposes) of the changeover switch is a bandpass path that contains an amplifier and a bandpass filter.

Adjoining downstream (e.g., in the direction of the A/D converter for signaling purposes) of the lowpass path of the input diplexer is a lowpass path that contains an amplifier and a lowpass filter.

In this case, the signal outputs of the filters (bandpass filter in the bandpass path, lowpass fitter in a lowpass path) are connected to an input of the A/D converter for signaling purposes via a common summation point. This summation point then has the individual frequency band of the TiM coil at 63.6 MHz or the intermediate frequency band pair IF of the TiM4G coil of 8.6 and 11.4 MHz applied to it, which are then also applied to the input of the A/D converter for digitization.

The A/D converter converts the analog signals of the individual frequency band of the TiM coil of 63.6 MHz or the intermediate frequency band pair IF of the TiM4G coil of 8.6 and 11.4 MHz into digital signals of the individual frequency band RF of the TiM coil of 16.4 MHz (e.g., frequency converted) or the intermediate frequency band pair IF of the TiM4G coil of 8.6 and 11.4 MHz (e.g., frequency unchanged) in a known manner.

In addition, the A/D converter optionally has a decimation filter unit that is configured to decimate the data rate of the output signal from 80 MS/s, for example, to 40 MS/s, for example.

The digital signal processor DSP is configured to isolate the frequency bands of the frequency band pairs from one another and to perform spectral conversion on these and also the individual frequency bands and to reduce the data rate. By way of example, it is thus possible for the data rate to be reduced by the digital signal processor from 40 MS/s to 10 MHz. Thus, either the frequency of the digital signal of the individual frequency band RF of the TiM coil may be converted from 16.4 MHz to 1.4 MHz or the frequency of the digital signal of the intermediate frequency band pair IF of the TiM4G coil may be converted from 8.6 MHz/11.4 MHz to 1.4 MHz in each case.

The Weaver unit of the digital signal processor has two Weaver signal paths, each of which contains a first 90° quadrature mixer, a downstream frequency filter, a downstream decimation chip, and a downstream second 90° quadrature mixer.

In this case, the 90° quadrature mixers are configured so that the digital signals from the individual frequency bands and/or from the frequency band pairs are each mixed with an oscillator signal, the frequency of which corresponds to one quarter of the respective mixer clock rate.

The frequency filters are in this case in the form of, depending on local coil type (e.g., TiM, TiM4G), switchable lowpass filters (e.g., for TiM4G) and bandpass filters (e.g., for TiM), so that the frequency filters are in the form of lowpass filters for the TiM4G local coil in the TiM4G mode with frequency band pairs and in the form of bandpass filters for the TiM local coil in the TiM mode with the individual frequency bands. The bandpass filter for the TiM configuration advantageously comprising a cascade including lowpass filter and highpass filter. In this case, the lowpass filter is used as a decimation filter, while the highpass filter acts as a mirror-image filter for the subsequent mixing in the second 90° quadrature mixer. The highpass filter may therefore be arranged downstream of the decimation stage and operates at the reduced clock rate of 20 MS/s.

The decimation filter unit DFE of the digital signal processor, which decimation filter unit is connected downstream of the Weaver unit, has two DFE signal paths in the decimation filter unit, each of which contains a frequency filter, a downstream decimation chip, and a downstream mixer.

The two DFE signal paths of the decimation filter unit are configured to feed the added digital signals from the two Weaver quadrature signal paths into one of the DFE signal paths and the subtracted digital signals from the two Weaver quadrature signal paths into the other of the DFE signal paths.

The frequency filters of the decimation filter unit are in the form of lowpass filters.

The mixers of the decimation filter unit are configured to convert frequencies of the digital signal pairs (TiM4G) (FS/2 conversion) and to retain the frequency of the digital signal (TiM).

DETAILED DESCRIPTION

Figure 1:
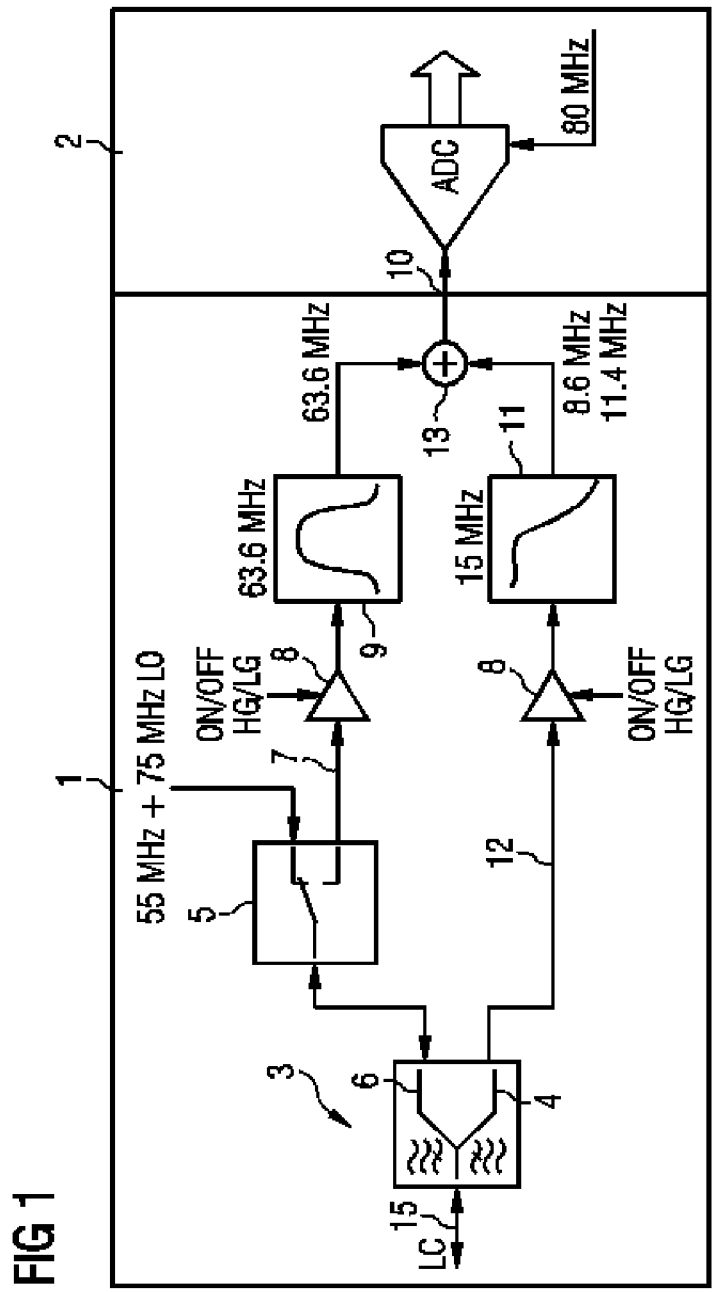
FIG. 1 depicts a schematic illustration of an embodiment of a local coil analog receiver with an A/D converter.

FIG. 1 depicts a local coil analog receiver 1 with an A/D converter 2 as part of the reception system 117 for transmitting magnetic resonance signals from local coils 106a, 106b (LC) of a magnetic resonance imaging (MRI) scanner 101.

The 1.5 T receiver architecture presented below is based on direct sampling of the interface signals from the local coil LC at a sampling rate of 80 MS/s (Mega Samples per second) and allows processing of either TiM interface signals from an earlier generation or of TiM4G interface signals from a more recent generation.

In TiM4G mode, the 2:1 FDM (frequency division multiplex) intermediate frequency (IF) signal is injected into the lower lowpass receiver path 4 via the input diplexer 3. The requisite local oscillator (LO) signals of 55 MHz and 75 MHz are injected into the supply line cable in the direction of the local coil 106a, 106b (LC) by changeover switch 5 via the highpass path 6 of the diplexer 3. The 2:1 FDM IF signal is not subjected to spectral isolation prior to the sampling at 80 MS/s, (Nyquist sampling). In TiM mode, the 63.6 MHz RF signal is injected into the upper bandpass receiver path 7 via the highpass path 6 of the input diplexer 3 and, following amplification by the amplifier 8 and filtering by bandpass filter 9, is likewise sampled at 80 MS/s (bandpass undersampling). In order to keep the demands on filters 9, 11 acting as initializing filters as low as possible, the amplifier 8 in the respective inactive receiver path 7, 12 is shut down. This measure prevents noise from this path from reaching the input 10 of the A/D converter 2 (ADC) via the summation point 13 and reducing the signal-to-noise ratio (SNR) of the received signal as a result of noise folding (aliasing).

The bandpass filter 9 denoted by 63.6 MHz is the antialiasing filter for the TiM path 7. The lowpass filter 11 denoted by 15 MHz is the antialiasing filter for the TiM4G path 12. Both filters 9, 11 forward their signals to the summation point 13, which is connected for signaling purposes to the input 10 of the ADC. The task of the antialiasing filter 9, 11 is to limit the spectrum of the analog signal processed by the ADC to a Nyquist band of the sampling. Filter 9, 11 needs to adequately reject all the alias frequency bands from the sampling (e.g., by 40 dB in each case).

The position of the IF bands (TiM4G), of the MR-RF band (TiM), and of the relevant alias bands of the sampling at 80 MS/s, and the way in which the TiM RF band (e.g., at 63.6 MHz) is folded into the first Nyquist band (e.g., 16.4 MHz) by bandpass undersampling correspond to DE 10 2008 023 467 B4.

Figure 2:
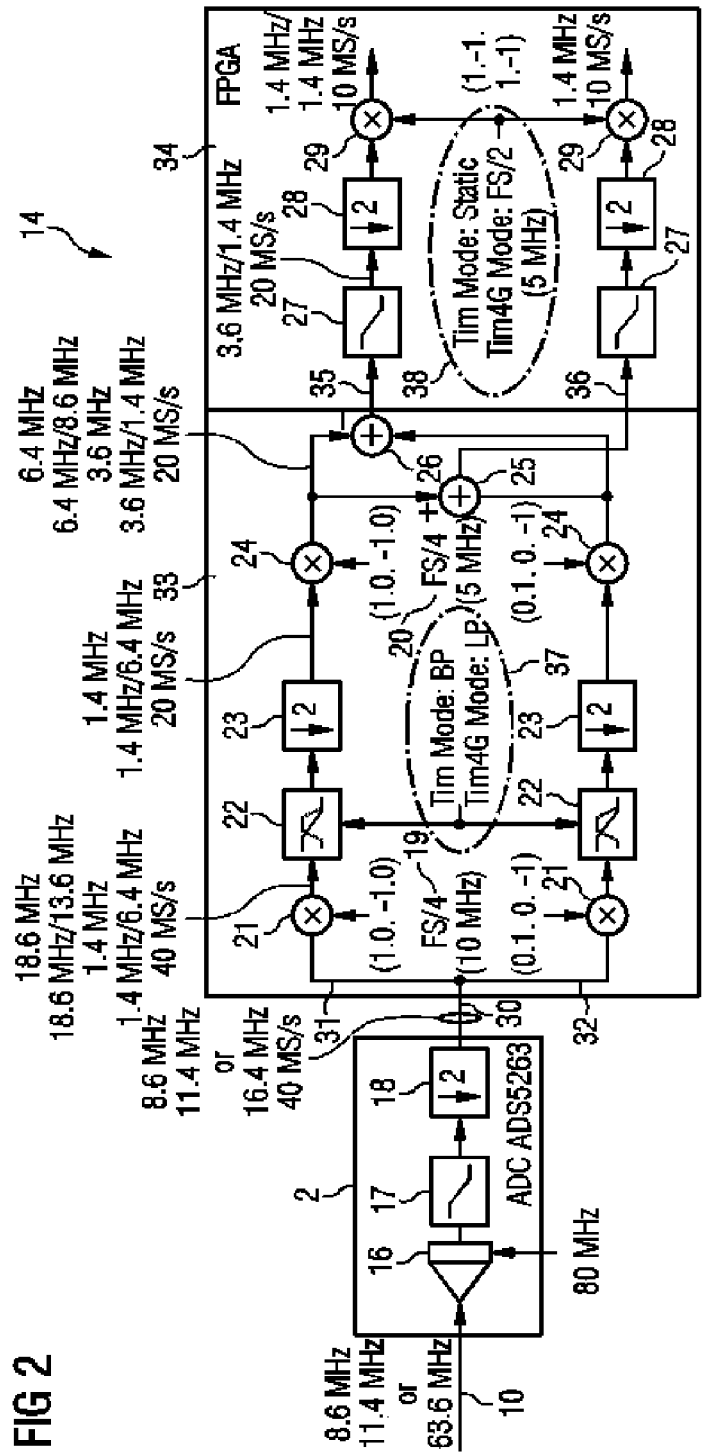
FIG. 2 depicts a schematic illustration of the A/D converter depicted in FIG. 1 with a digital signal processing processor (DSP).

FIG. 2 depicts a schematic illustration of the A/D converter 2 depicted in FIG. 1, to which a digital signal processing (DSP) processor is connected, as part of the reception system 117 for transmitting magnetic resonance signals from local coils 106a, 106b (LC) of the magnetic resonance imaging (MRI) scanner 101.

The A/D converter 2 on the far left of FIG. 2 corresponds in this case to the A/D converter 2 on the far right of FIG. 1. The output signals from the local coil analog receiver 1, which are introduced into the downstream A/D converter 2 of FIG. 1 via the input 10, therefore correspond to the input signals for the A/D converter as depicted in FIG. 2, which is connected upstream of the digital signal processing processor 14 (DSP). In other words, the A/D converter 2 (visible on the right of FIG. 1 and on the left of FIG. 2) connects the local coil analog receiver 1 of FIG. 1 to the digital signal processing processor 14 (DSP) of FIG. 2. The circuit 1 of FIG. 1 is therefore connected upstream of the circuit 14 of FIG. 2, the A/D converter 2 in FIGS. 1 and 2 being a common A/D converter 2.

The block diagram depicts a very efficient digital signal processing processor 14 (DSP) based on what is known as a "Weaver architecture". The layout depicted allows both TiM4G received signals at the intermediate frequencies IF (e.g., IF=8.6 MHz and 11.4 MHz) and TiM received signals at the radiofrequency RF (e.g., RF=63.6 MHz) to be processed.

The DSP has the task of isolating the two FDM channels from one another (e.g., in TiM4G mode) and of reducing the data rate of the data coming from the ADC ("downsampling").

The data processing that follows the DSP block 14 does not require the system to know the type of currently active LC interface 15 (e.g., TiM or TiM4G). In particular, the data rate may be reduced to 5 MS/s without further preprocessing.

In the block diagram depicted for the DSP 14, the first decimation stage 17, 18 is situated in the ADC chip 2 (in this case, ADS5263 from Texas Instruments, for example). This relieves the load on the FPGA (Field Programmable Gate Array) of the DSP 14.

The second decimation stage is part of the "Weaver architecture" and allows simple 1, −1, 1, −1 implementation (FS/4 frequency conversion) for the first and second NCOs (Numerically Controlled Oscillator) 19, 20.

With regard to FS/2 and FS/4 frequency conversion: an aspect is that for particular frequency ratios "oscillator frequency to sampling frequency" (FS/2 and FS/4), the requisite multiplications are reduced to manipulation of the arithmetic sign (or zeroing).

The frequencies obtained in the digital signal processing are indicated in MHz in FIG. 2 as follows.

| | ADC 2 input 10 in MHz | DSP 14 input 30 in MHz | Mixer 21 output in MHz | Mixer 24 input in MHz | Mixer 24 output in MHz | Filter 27 output in MHz | Mixer 29 output in MHz |
|---|---|---|---|---|---|---|---|
| LC: TiM 63.6 MHz | 63.6 | 16.4 | Path31: 13.6 path32: 6.4 | 6.4 | Path31: 8.6 path32: 1.4 | Path 35 and 36: 1.4 | Path35 and 36: 1.4 |
| LC: TiM4G 11.4 | 11.4 | 11.4 | Path31: 18.6 Path32: | 1.4 | Path31: 6.4 Path32: | Path35: and 36: | Path35 and 36: 1.4 |

-continued

| | ADC 2 input 10 in MHz | DSP 14 input 30 in MHz | Mixer 21 output in MHz | Mixer 24 input in MHz | Mixer 24 output in MHz | Filter 27 output in MHz | Mixer 29 output in MHz |
|---|---|---|---|---|---|---|---|
| MHz LC: TiM4G 8.6 MHz | 8.6 | 8.6 | 1.4 Path31: 18.6 Path32: 1.4 | 1.4 | 3.6 Path31: 6.4 Path32: 3.6 | 3.6 Path35: and 36: 3.6 | Path35 and 36: 1.4 |

In TiM mode, the filters 22 downstream of the first mixers 21 are operated as bandpass filters. Thus, noise at 3.6 MHz is rejected that, as a result of the subsequent mixing of the second mixers 24 at FS/4 (e.g., 5 MHz), would be converted to 1.4 MHz and would result in an SNR reduction for the received signal. In TiM4G mode, lowpass filtering is sufficient in order to meet the demands resulting from the subsequent decimation in the decimation chips 23.

The mode of operation may be selected either by software or by a 1 bit control signal. The changeover between TiM mode and TiM4G mode is effected by the switch 37, which changes over the filters 22 between bandpass filter and lowpass filtering.

The circuit 14 of FIG. 2 corresponds to a Weaver architecture, which is fundamentally known from the prior art, as far as downstream of the adder 25 and subtractor 26 stages.

The text below describes the functions of the circuit depicted in FIG. 2 in more detail, based on the signal flow from left to right.

The mixers 21 are depicted as a circle with a cross. The filters 22 each adjoin directly and are depicted in two parts with decimation chips 23 as decimation filters (downward arrow).

1) Analog/digital conversion is at 80 MS/s by A/D chip 16 of the A/D converter 2.

2) Decimation to 40 MS/s (decimation filter 17, 18 integrated in the ADC converter 2 in this case, is represented by a lowpass filter 17 and decimation chip 18 (decimation by two)). The two IF signals of the TiM4G mode remain at 8.6 MHz and 11.4 MHz. The frequency of the TiM RF signal is converted from 63.6 MHz to 16.4 MHz by the sampling at 80 MS/s.

3) Splitting of the output 30 of the A/D converter 2 is into two signal paths 31, 32 of the DSP 14.

4) Mixing with 90°-offset oscillator signals is by quadrature mixer 21. This produces a phase offset for the two signal elements of 90° in relation to one another. Since the chosen oscillator frequency of the oscillator 19 corresponds to one quarter of the clock frequency, the cosine signal at the frequency FS/4 may easily be produced by a 1, 0, −1, 0 . . . sequence. The 90°-offset sinusoidal signal at the frequency FS/4 may accordingly be produced by a 0, 1, 0, −1 . . . sequence. The mixing of the frequencies of the signals in the mixer 21 is thereby reduced to very simple arithmetic sign operations. The two TiM4G IF signals are spectrally symmetrical with respect to the 10 MHz oscillator frequency of the oscillator 19. Following the mixing in the mixer 21, these signals therefore both appear at 1.4 MHz (e.g., 11.4 MHz−10 MHz=1.4 MHz and 10 MHz−8.6 MHz=1.4 MHz). The 8.6 MHz signal may thus be visualized as a mirror-image frequency signal at 11.4 MHz signal reception and the 11.4 MHz signal may thus be visualized as a mirror-image frequency signal at 8.6 MHz signal reception. The two components are isolated by the "Weaver architecture" of the Weaver unit 33 of the DSP 14.

5) Lowpass filtering by filter 22 and decimation by decimation chip 23 is from 40 MS/s to 20 MS/s (TiM4G mode), or bandpass filtering by filter 22 and decimation by decimation chip 23 is from 40 MS/s to 20 MS/s (TiM mode). In TiM mode, the received signal appears after the first mixing by mixer 21 to 6.4 MHz. The mirror-image frequency of the subsequent mixing by mixer 24 at 5 MHz is 3.6 MHz (e.g., IF=|5 MHz+−F-signal|=>received signal frequency=6.4 MHz, mirror-image frequency=3.6 MHz) and needs to be rejected by the BP filter 22. The frequency limit of the upper stop band is determined by the demand for rejection of the alias frequency band of the decimation by decimation chip 23 from 40 MS/s to 20 MS/s (e.g., for 13.6 MHz-500 KHz). The BP filter 22 of the TiM4G configuration advantageously comprising a cascade including lowpass filter and highpass filter. In this case, the lowpass filter is used as a decimation filter, while the highpass filter acts as a mirror-image filter for the subsequent mixing in the second 90° quadrature mixer. The highpass filter may therefore be arranged downstream of the decimation stage and operates at the reduced clock rate of 20 MS/s. In TiM4G mode, the mirror-image frequency band is above the oscillator frequency of the oscillator 19 of 5 MHz. In this case, the TP filter 22 rejects signals at the mirror-image and alias frequencies.

6) Mixing with 90°-offset oscillator signals is by quadrature mixer 24. This reduces an additional phase offset for the two signal elements of 90° in relation to one another.

7) Addition of the two signal elements in the adding chip 25 channels out the 3.6 MHz IF signal produced from the 8.6 MHz signal in the TiM4G mode; subtraction of the two signal elements in the subtracting chip 26 channels out the 3.6 MHz IF signal produced from the 11.4 MHz signal in the TiM4G mode and the 1.4 MHz IF signal produced from the 16.4 MHz signal in the TiM mode.

8) In each case, there is an adjoining decimation filter unit 34 (20 MS/s to 10 MS/s) having a lowpass filter 27 and a decimation chip 28 and also a mixer 29.

9) In TiM4G mode, the two IF signals are each converted from 3.6 MHz to 1.4 MHz by FS/2 conversion. In TiM mode, the signal is simply passed through (multiplication by 1, 1, 1, . . . ), since it is already at 1.4 MHz. The word "static" in FIG. 2 thus provides that in TiM mode the last mixer 29 is operated either as a polarity reverser (1, −1, 1, −1 . . . ) or statically, which is to say just "1". The mode of operation may be selected either by software or by a 1-bit control signal. The changeover between TiM mode and TiM4G mode is effected by the switch 38, which changes over the mixers 29 between a polarity reversal mode and a static mode.

Figure 3:
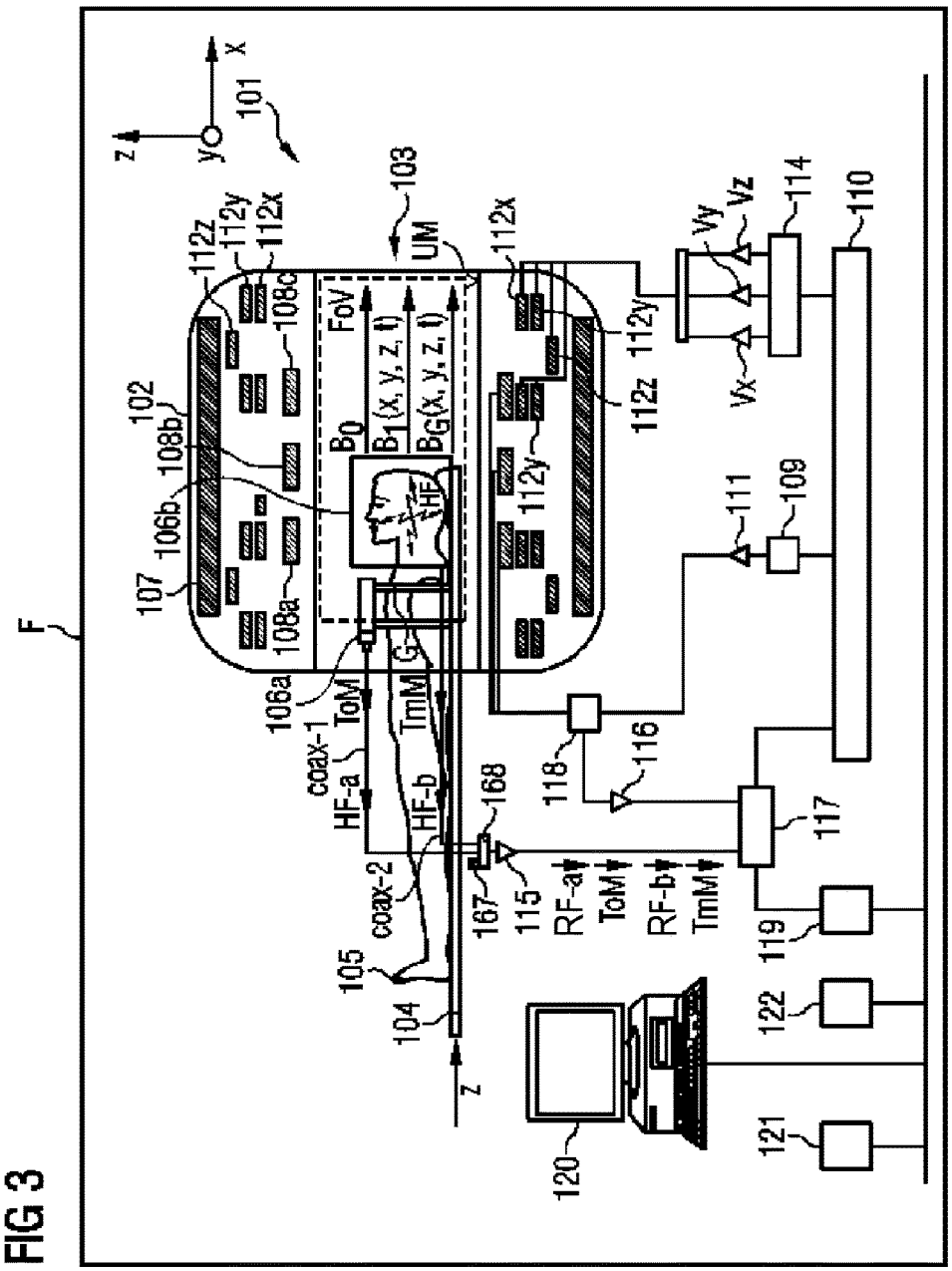
FIG. 3 depicts a schematic illustration of an embodiment of a magnetic resonance imaging scanner containing a reception system for transmitting magnetic resonance signals from local coils as depicted in FIGS. 1 and 2.

FIG. 3 now depicts a schematic illustration of a magnetic resonance imaging scanner containing a reception system for transmitting magnetic resonance signals from local coils as depicted in FIGS. 1 and 2.

FIG. 3 depicts an imaging magnetic resonance scanner MRI 101 that is situated in a shielded room or Faraday cage F, the scanner having a whole-body coil 102 with a chamber 103, in this case tubular, into which a patient's couch 104 with a body, e.g. of an examination object (e.g. of a patient) 105, may be moved (with or without a local coil arrangement 106a; 106b, which is also termed a local coil for short) in the direction of the arrow z in order to generate scans of the patient 105 by an imaging method. In this case, the patient has two local coil arrangements 106a; 106b (a head coil 106a and a chest coil 106b) arranged on him, the local arrangements each being able to be used to generate, in a local region (also called field of view or FOV) of the MRI, scans of a subregion of the body 105 in the FOV. Signals RF from the local coil arrangement 106a; 106b may be evaluated (e.g., converted into images, stored or displayed) by an evaluation device (168, 115, 117, 119, 120, 121, etc.) of the MRI 101, which evaluation device may be connected to the local coil arrangement 106a; 106b by coaxial cables coax1, coax2, for example.

In order to use a magnetic resonance scanner MRI 101 to examine a body 105 (an examination object or a patient) by magnetic resonance imaging, the body is exposed to various magnetic fields whose temporal and spatial characteristics match one another as precisely as possible. A powerful magnet (e.g., a cryomagnet 107) in a measuring cabin with an opening 103, in this case in tunnel form, produces a static powerful main magnetic field $B_0$ that, by way of example, amounts to 0.2 Tesla (T) to 3 T or more. A body 105 to be examined is moved, on a patient's couch 104, into a region of the main magnetic field B0 that is approximately homogeneous in the field of view FoV. Nuclear spin in atomic nuclei of the body 105 is excited by magnetic radiofrequency excitation pulses B1 (x, y, z, t) at a frequency RF-F that are radiated in by a radiofrequency antenna (and/or possibly a local coil arrangement) that is depicted in a simplified form here as a body coil 108 (e.g., a multipiece body coil=108a, 108b, 108c). Radiofrequency excitation pulses are produced by a pulse generation unit 109, for example, which is controlled by a pulse sequence control unit 110. Following amplification by a radiofrequency amplifier 111, the radiofrequency excitation pulses are routed to the radiofrequency antenna 108. The radiofrequency system depicted here is merely indicated schematically. Often, more than one pulse generation unit 109, more than one radiofrequency amplifier 111 and a plurality of radiofrequency antennas 108 a, b, c are used in a magnetic resonance scanner 101.

In addition, the magnetic resonance scanner 101 has gradient coils 112x, 112y, 112z that are used during a measurement to radiate in magnetic gradient fields $B_G$ (x, y, z, t) for selective layer excitation and for local coding of the measurement signal RF. The gradient coils 112x, 112y, 112z are controlled by a gradient coil control unit 114 (and possibly by amplifiers Vx, Vy, Vz) that, like the pulse generation unit 109, is connected to the pulse sequence control unit 110.

Signals RF transmitted by the excited nuclear spins (e.g., in the atomic nuclei in the examination object) are received by the body coil 108 and/or at least one local coil arrangement 106a; 106b, amplified by associated radiofrequency preamplifiers 116, 115 and processed further and digitized by a magnetic resonance imaging system received-signal further handling device 117. The recorded measuring data are digitized and are stored as complex numerical values in a k-space matrix. Multidimensional Fourier transformation may be used to reconstruct an associated MR image from the k-space matrix filled with values.

For a local coil that may be operated both in transmission mode and in reception mode, such as the body coil 108 or a local coil 106a; 106b, the signal forwarding is effected by an upstream transmission/reception switch 118.

An image processing unit 119 takes the measurement data and produces an image that is depicted to a user by a control console 120 and/or is stored in a memory unit 121. A central computer unit 122 controls the individual installation components.

In MR imaging, images with a high signal-to-noise ratio (SNR) may be recorded using what are known as local coil arrangements (coils, local coils). These are antenna systems that are mounted in direct proximity on (e.g., anterior), under (e.g., posterior), at the body 105, or in the body 105. During a MR measurement, the excited nuclei induce a voltage in the individual antennas of the local coil, which voltage is then amplified using a low noise preamplifier (e.g., LNA, preamp) and forwarded to the reception electronics. To improve the signal-to-noise ratio for high resolution images too, what are known as high field installations are used (e.g., 1.5 T-12 T or more). If it is possible to connect more individual antennas to an MR reception system than there are receivers, a switching matrix (also called RCCS), for example, is installed between reception antennas and receiver. The switching matrix routes the currently active reception channels (e.g., those that are currently in the field of view of the magnet) to the existent receivers. This allows more local coil elements to be connected than there are receivers, since in the case of whole-body coverage it is necessary to read only the local coils that are in the FoV (Field of View) or in the homogeneity volume of the magnet.

By way of example, an antenna system that may include one or, as an array coil, of a plurality of antenna elements (in particular, local coil elements), for example, may be referred to as a local coil arrangement 106a, 106b. These individual antenna elements are embodied as loop antennas (e.g., loops), butterfly coils, flex coils or saddle coils, for example. A local coil arrangement includes, by way of example, local coil elements, a preamplifier, further electronics (e.g., sheath current chokes, etc.), a housing, supports, and optionally a cable with a connector that connects them to the MRI installation. A receiver 117 fitted on the installation side filters and digitizes a signal RF received from a local coil 106a; 106b and transfers the data to a digital signal processing device that may derive an image or a spectrum from the data obtained by a measurement and makes it available to the user, e.g., for subsequent diagnosis by him and/or for storage.

For the operation of local coils 106a, 106b (such as the chest coil 106a and head coil 106b in FIG. 2) on MRI systems 101, various architectures for transmitting signals RF (received from a patient 105 during an imaging MRI measurement) from a local coil 106a; 106b (e.g., as a preprocessed signal or a non-preprocessed signal, RF-a, RF-b) to an MRI system 101 are known. In this case, a distinction is drawn, by way of example, between the coding (in particular, analog/digital) of the information transmitted in signals RF-a, RF-b and the type of transmission of the signals RF-a, RF-b (in particular, electrical/optical). In today's MRI systems 101, analog electrical systems and digital optical methods are used for transmission, and it is possible to distinguish whether the information is transmitted at the original frequency (e.g., at the signals RF received from a local coil) or (e.g., in analog or digital form) at an intermediate frequency.

In respect of apparatuses that are described by the name "TIM4G" (and/or TmM type apparatus), DE 10 2008 023 467 B4 has described apparatuses and methods for converting the RF signal RF from the MR reception antenna to an intermediate frequency IF that are able to afford many and varied advantages. In order to be able to connect ToM (a ToM local coil type may be a local coil type without mixing to an intermediate frequency range, for example, and/or a TIM system, for example) local coils 106*a*, which (106*a*) transmit RX (received) signals RF at the radiofrequency of an MRI system 101 (=Larmor frequency of an MRI system 101) to an MRI system 101, for example, also to TmM (a TmM local coil type may be a local coil type with mixing to an intermediate frequency range, for example, and/or a TIM4G system) local coils 106*b* and/or systems (with conversion of the RF signal RF from the MR local coil 106*b* to an intermediate frequency, for example), and/or further other systems, adapter solutions have been developed that both set up the mechanical compatability (e.g., different connector systems) and undertake the conversion of the RF signal RF to an intermediate frequency IF. Such an adapter thus allows backward compatibility of the local coil interface.

It is also possible to realize mechanical compatibility for different types ToM, TmM of local coils 106*a*; 106*b* by converting the connectors (e.g. converting the connectors used for local coils of different local coil type (CoTy) (such as ToM connectors to TmM connectors)).

One aspect of refinements is the compatibility of the transmission techniques for different local coil types such as (by way of example) ToM (a ToM local coil type may be a local coil type without mixing in an intermediate frequency range, for example), TmM (a TmM local coil type may be a local coil type with mixing in an intermediate frequency range, for example) or any others. To this end, the following features may expediently be existent.

For example, in one embodiment, a reception system (also called RX system, e.g. the magnetic resonance imaging system received-signal further handling device 117) of the MRI 101 receives (e.g. by cable 168) from at least one local coil 106*a*, 106*b* a piece of information (e.g. "ToM" or "TmM" or others) about the connected local coil type (ToM, TmM, etc.), whereupon the MRI 101, 117 processes (117) received (from the patient 105 during imaging using the MRI 101) and forwarded signals (e.g. RF-a from a local coil 106*a* of ToM type and/or signals RF-b from a local coil 106*b* of TmM type and/or others) further according to local coil type and hence possibly signal type (RF transmission/IF intermediate frequency transmission, etc. of the signals RF-a, RF-b), if necessary in different ways.

Settings that may sometimes be set in the MRI 101, 117 (e.g., in a module FPGA that processes radiofrequency signals RF-a, RF-b further) on the basis of the information ToM, TmM about the local coil type (e.g., ToM, TmM or others) include the following, for example: (1) settings for the analog postprocessing of the signals RF-a, RF-b outside the local coil, which is to say in the MR system 117, 101; (2) settings for filters (connection, changeover, disconnection, detuning) in the MRI system 101, 117; (3) connection/disconnection of local oscillator signals, e.g., for converting signals RF-a, RF-b transmitting at intermediate frequencies IF (according to DE 10 2008 023 467 B4, for example, full content of which is hereby part of this application (="incorporated by reference")) to other frequencies; (4) settings for gains or attenuations for gain equalization between two concepts; (5) settings for analog compression properties; (6) settings for an analog multiplexer (e.g., in respect of a multiplex frequency); (7) particularly when a local coil 106*a* transmits signals RF-a to a device (such as 168 and/or 167 and/or 117) of the MRI 101 using frequency division multiplexing; (8) settings for the sampling rate of an analog/digital converter ADS; and (9) settings for the digital post-processing (following digitization) of signals RF-a, RF-b, such as, particularly: (a) expansion in the case of preceding analog compression, (b) frequency conversion by mixing with an NCO signal (Numeric Controlled Oscillator), (c) decimation; and (d) a change in the frequency of a digital IF signal RF-b (from the same position or an inverse position).

The information (in this case denoted by the reference symbols "ToM", "TmM", etc.) about what local coil type (such as, by way of example, ToM, TmM, or others) is present may be transported, for example, using an analog code or a digital code that is implemented or stored in the local coil 106*a*, 106*b*, to a device (such as, by way of example, 168 and/or 167 and/or 117) of the MRI system 101 and/or may be stored in a file in the MRI system 101 (e.g., in a magnetic resonance imaging system received-signal further handling device 117), to which file a piece of information in the local coil 106*a*; 106*b* refers. Besides analog and digital coding options, there is also the possibility of coding using shorting plugs, RFIDs, or other variants on an interface (L-S1, L-S2). On the basis of what are known as local coil codes (or on the basis of a file to which a code refers), the MRI system 101, 117 may identify what local coil type (ToM, TmM, etc.) is involved and may then decide which of the, by way of example, aforementioned parameters (e.g., in respect of the further handling (ADC, FPGA, VE, FI, MI) of the signals RF-a, RF-b in the MRI 101, 117) is set in what way. In this case, it is also possible to distinguish between more than two local coil types ToM, TmM, etc.

In a second embodiment, in the event of the combination of an RF architecture with an IF architecture (that is to say, by way of example, in FIG. 1 of transmission of signals RF-a at the RF frequency of, by way of example, 63 MHz of the MRI 101, 108*a*-*c* and transmission of signals RF-b at one or more intermediate frequencies IF of 8 MHz and 12 MHz, for example, which are different than the RF frequency of the MRI 101, 108*a*-*c*), a receiver that is able to process both frequency bands may be a reception system that may be configured as a direct receiver, as super heterodyne receiver system, as a double super heterodyne receiver system or as a multiple super heterodyne receiver system.

In this case, one aspect is the availability of the information (e.g., ToM, TmM, etc.) about the local coil type of a local coil 106*a*, 106*b*, etc., connected to the MRI 101, 117, and the capability of a receiver (e.g., of the magnetic resonance imaging system received-signal further handling device 117) to deal with different frequency bands, frequencies (e.g., inverse position, same position), and different amplitudes. There is also the possibility of using local coils 106*a*; 106*b* of different local coil type ToM, TmM in the same measurement (that is to say simultaneously). A DS receiver as in FIG. 1 may also handle signals RF-a, RF-b from local coils of different local coil type ToM, TmM during the same imaging MRI measurement, for example.

Additional possible implementation details may include the following.

The infrastructure that is needed by the various local coil types ToM, TmM is also able/provided to be available on the local coil interface (L-S). If the electronics of a local coil of one local coil type (ToM) require 10V as a supply for their electronics, for example, but the electronics of a local coil of a further local coil type (TmM) require 3V, then both voltages may be made available in parallel (e.g., on at least one interface L-S1 and LS2 at the MRI 117, 101) or may be set as appropriate on the basis of the local coil type (ToM, TmM etc.).

If the identification of a local coil type ToM, TmM itself presupposes the presence of a voltage, the voltage may, if need be, be provided as an auxiliary voltage and the actual electronics operating voltage may be connected thereafter.

If the tuning circuits in the various local coil type (ToM, TmM, etc.) have different demands on the MRI system (e.g., in respect of current/voltage/changeover speed), this may likewise be stored as a piece of information (e.g., in what is known as a coil file or coil code) and the MRI system may react accordingly.

There may be an advantage in a design of an MR reception system and control system that provides a multi-mode local coil interface that is compatible with different local coil signal transmission methods. This may allow backward compatibility with "old" coils 106a; 106b even without the use of additional adapter connectors, for which there may possibly also be no space on a patient's couch, or which may have disadvantages for the workflow and costs.

It may be possible to use, by way of example, systems ("ToM") with RF Lamor frequency transmission and/or in which the active local coil electronics includes only one LNA with systems ("TmM") with intermediate frequency (IF) transmission using frequency division multiplexing FDM, (e.g., active) local coil electronics including LNA, mixer and FDM combiners, etc. on an MRI.

Further handling of signals (e.g., received from an examination object with a local coil) at the reception end (also called RX end), which may be activated on the basis of the coil type ToM, TmM, may involve, by way of example, the decision about processing of signals with an analog/digital converter ADC and/or an FPGA and/or analog components, such as, by way of example, preamplification (and/or amplification) VE, filtering FI and/or mixing MI.

Finally, it is pointed out once again that the methods described above in detail and the illustrated magnetic resonance imaging system are merely exemplary embodiments that may be modified by a person skilled in the art in a wide variety of ways without departing from the field of the invention. In addition, the use of the indefinite article "a" or "an" does not preclude the features in question from also being existent multiple times. Similarly, the terms "unit" and "module" do not preclude the components in question including a plurality of interacting subcomponents that, if need be, may also be distributed in space.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. An apparatus for a reception system for transmitting magnetic resonance signals from local coils to an image processing unit of a magnetic resonance imaging system, the apparatus comprising:
   an analog receiver for receiving and processing analog signals from the local coils, the analog receiver configured to directly sample analog signals having different individual frequency bands, frequency band pairs, or frequency bands and frequency band pairs, to distinguish the analog signals and to process the analog signals differently;
   an analog/digital (A/D) converter for converting the processed analog signals from the local coils into digital signals; and
   a digital signal processor for processing the digital signals, the digital signal processor comprising a Weaver unit and a downstream decimation filter unit (DFE).

2. The apparatus as claimed in claim 1, wherein the analog receiver comprises an input diplexer having a highpass path and a lowpass path,
   wherein the highpass path of the input diplexer comprises a changeover switch for feeding back a local oscillator frequency to the input diplexer and then to the local coils,
   wherein adjoining downstream of the changeover switch is a bandpass path comprising a bandpass amplifier and a bandpass filter,
   wherein adjoining downstream of the lowpass path of the input diplexer is a lowpass path comprising a lowpass amplifier and a lowpass filter,
   wherein signal outputs of the bandpass filter and the lowpass filter are connected for signaling purposes to an input of the A/D converter via a common summation point.

3. The apparatus as claimed in claim 2, wherein the A/D converter comprises a decimation filter unit comprising a decimator lowpass filter and a decimator, the decimator configured to output one or more of the frequency bands converted by sampling at 80MS/s or a frequency-unchanged frequency band pair of the digital signals at a reduced data rate.

4. The apparatus as claimed in claim 3, wherein the digital signal processor is configured to isolate the frequency bands of the frequency band pairs from one another and to convert a frequency of the frequency band pairs and the individual frequency bands and to reduce the data rate.

5. The apparatus as claimed in claim 4, wherein the Weaver unit of the digital signal processor comprises two Weaver signal paths, wherein each Weaver signal path comprises a first 90° quadrature mixer, a downstream frequency filter, a downstream decimation chip, and a downstream second 90° quadrature mixer.

6. The apparatus as claimed in claim 5, wherein the first and second 90° quadrature mixers of the decimation filter unit are configured to convert frequencies of the signals from the frequency band pairs and to retain the frequency of the frequency band.

7. The apparatus as claimed in claim 1, wherein the A/D converter comprises a decimation filter unit comprising a lowpass filter and a decimator, the decimator configured to output one or more of the frequency band converted by sampling at 80 MS/s or a frequency-unchanged frequency band pair of the digital signals at a reduced data rate.

8. The apparatus as claimed in claim 1, wherein the digital signal processor is configured to isolate the frequency bands of the frequency band pairs from one another and to convert a frequency of the frequency band pairs and the individual frequency bands and to reduce a data rate.

9. The apparatus as claimed in claim 1, wherein the Weaver unit of the digital signal processor comprises two Weaver signal paths, wherein each Weaver signal path comprises a first 90° quadrature mixer, a downstream frequency filter, a downstream decimation chip, and a downstream second 90° quadrature mixer.

10. The apparatus as claimed in claim 9, wherein the first and second 90° quadrature mixers are configured such that the digital signals from one or more of the individual frequency bands or the frequency band pairs are mixed with an oscillator frequency that corresponds to one quarter of a mixer clock rate.

11. The apparatus as claimed in claim 9, wherein the frequency filters are in the form of switchable lowpass filters or bandpass filters, wherein the bandpass filter comprises a cascade comprising a lowpass filter and a highpass filter, wherein the lowpass filter is a decimation filter and the highpass filter is arranged downstream of a decimation stage and operates at a reduced clock rate of 20 MS/s.

12. The apparatus as claimed in claim 9, wherein the decimation filter unit of the digital signal processor is connected downstream of the Weaver unit and comprises a first DFE signal path and a second DFE signal path in the decimation filter unit, wherein each DFE signal path comprises a frequency filter, a downstream decimation chip, and a downstream mixer.

13. The apparatus as claimed in claim 12, wherein the two Weaver signal paths are configured to channel added digital signals from the two Weaver signal paths out of a first Weaver signal path of the two Weaver signal paths and subtracted digital signals from the two Weaver signal paths out of a second Weaver signal path of the two Weaver signal paths into a respective DFE signal path.

14. The apparatus as claimed in claim 13, wherein the two DFE signal paths are configured to feed the added digital signals from the two Weaver signals paths into the first DFE signal path of the two DFE signal paths and the subtracted digital signals from the two Weaver signal paths into the second DFE signal path of the two DFE signal paths.

15. The apparatus as claimed in claim 12, wherein the two Weaver signal paths are configured to separate the frequency band pair entering the Weaver unit and to channel individual signals out of the first Weaver signal path and the second Weaver signal path, respectively, and to channel the individual signals into the first DFE signal path and the second DFE signal path, respectively.

16. The apparatus as claimed in claim 12, wherein the frequency filters of the decimation filter unit are lowpass filters.

17. The apparatus as claimed in claim 1, wherein a first 90° quadrature mixer and a downstream second 90° quadrature mixer of the decimation filter unit are configured to convert frequencies of the signals from the frequency band pairs and to retain a frequency of the frequency band.

18. A method for operating an apparatus for a reception system for transmitting magnetic resonance signals from local coils to an image processing unit of a magnetic resonance imaging system, the method comprising:
receiving and directly sampling, by an analog receiver, analog signals from the local coils, wherein the analog receiver directly samples analog signals having different individual frequency bands, frequency band pairs, or frequency bands and frequency band pairs, to distinguish the analog signals and to process the analog signals differently;
processing the analog signals by a digital signal processor having a Weaver unit and a downstream decimation filter unit; and
converting the processed analog signals from the local coils into digital signals, by the digital signal processor, wherein the frequency bands of the frequency band pairs are isolated from one another, and wherein a frequency of the frequency band pairs is converted and data rates thereof are reduced.

19. A magnetic resonance imaging system comprising:
local coils;
an image processing unit; and
an apparatus for a reception system for transmitting magnetic resonance signals from the local coils to the image processing unit, wherein the apparatus comprises:
an analog receiver for receiving and processing analog signals from the local coils, the analog receiver configured to directly sample analog signals having different individual frequency bands, frequency band pairs, or frequency bands and frequency band pairs, to distinguish the analog signals and to process the analog signals differently;
an analog/digital (A/D) converter for converting the processed analog signals from the local coils into digital signals; and
a digital signal processor for processing the digital signals, the digital signal processor comprising a Weaver unit and a downstream decimation filter unit.

* * * * *